(12) United States Patent
Tran et al.

(10) Patent No.: US 12,387,812 B2
(45) Date of Patent: Aug. 12, 2025

(54) PROTECTING MEMORY CONTROLS AND ADDRESS

(71) Applicant: XILINX, INC., San Jose, CA (US)

(72) Inventors: David Tran, San Jose, CA (US);
Federico Venini, San Jose, CA (US);
Sarosh I. Azad, Fremont, CA (US)

(73) Assignee: XILINX, INC., San Jose, CA (US)

( * ) Notice: Subject to any disclaimer, the term of this patent is extended or adjusted under 35 U.S.C. 154(b) by 234 days.

(21) Appl. No.: 18/109,744

(22) Filed: Feb. 14, 2023

(65) Prior Publication Data

US 2024/0274218 A1 Aug. 15, 2024

(51) Int. Cl.
| | | |
|---|---|---|
| *G11C 11/00* | (2006.01) | |
| *G11C 29/02* | (2006.01) | |
| *G11C 29/52* | (2006.01) | |

(52) U.S. Cl.
CPC ............ *G11C 29/52* (2013.01); *G11C 29/022* (2013.01)

(58) Field of Classification Search
CPC .............................. G11C 29/52; G11C 29/022
See application file for complete search history.

(56) References Cited

U.S. PATENT DOCUMENTS

| | | | | |
|---|---|---|---|---|
| 11,681,580 B2 * | 6/2023 | Song | ................... | G06F 11/1048 714/764 |
| 11,934,265 B2 * | 3/2024 | Nemati | ................. | G06F 11/106 |
| 12,013,752 B2 * | 6/2024 | Gurumurthi | ........ | G06F 11/0772 |

* cited by examiner

*Primary Examiner* — Pho M Luu
(74) *Attorney, Agent, or Firm* — Patterson + Sheridan, LLP

(57) ABSTRACT

A memory system that splits a data width (W) into N separate memories each of narrower width W/N is described. To protect a write enable (WE) signal, the WE signal is toggled and then stored in each of the N memories. A fault on the WE signal to any of the N memories results in its stored write detection bit being different from the write detection bits stored in the other N memories. This condition can then be detected upon any subsequent read by checking whether the write detection bits are equal. The memory system can also protect the address and control signals by generating parity bits that are stored in the N memories.

20 Claims, 4 Drawing Sheets

PROTECTING MEMORY CONTROLS AND ADDRESS

TECHNICAL FIELD

Examples of the present disclosure generally relate to detecting errors in memory controls and addresses.

BACKGROUND

Well-established mechanisms (such as parity and error correction codes (ECC)) have been widely used in the industry to protect the logic path feeding the data inputs to memories (RAMs, ROMs, etc.) against faults. However, there is no such well-established method to protect the logic paths feeding address and control inputs to memories, and the internal address and control decoding circuitry inside those memories.

Memory data (d) is often protected by a parity bit (P(d)) for each data word. One possible enhancement is to add the address (a) into the computation of this parity bit, resulting in a combined parity bit P(d+a) where the + sign represents the exclusive or (XOR) typically used for parity computation. However, this enhancement only catches 50% of single faults on the address lines (since the data portion is uncorrelated to the address and can flip the parity randomly with respect to it).

The Write Enable (WE) control signal presents further difficulty. Assuming the industry-standard protection method of computing and storing parity on the write data every RAM Write, a stuck-inactive fault on WE leaves the memory word unchanged including the previously written and presumably good data parity bit, so the fault would not be detected upon a subsequent read. A stuck-active fault results in the data parity being written every RAM clock, so the parity bit is always deemed good on a read, and thus, the fault goes undetected.

SUMMARY

Techniques for a detected errors in memory systems are described. One example is a memory system that includes a first memory configured to store a first portion of a data word during a write operation, a second memory configured to store a second portion of the data word during the write operation, write detection circuitry configured to receive as an input a write enable (WE) signal corresponding to the write operation and output write detection bits indicating a write occurred where one of the write detection bits is stored in the first memory during the write operation and another one of the write detection bits is stored in the second memory during the write operation, and error detection circuit configured to, during a read operation to retrieve the data word from the memory system, retrieve and compare the write detection bits stored in the first and second memories to determine whether there was an WE error.

Another embodiment described herein is a method that includes receiving, during a write operation, a data word to be written into a memory system including a first memory and a second memory, storing a first portion of the data word in the first memory and a second portion of the data word in the second memory, toggling a WE signal associated with the data word to generate first and second toggled bits, storing a first toggled bit in the first memory and a second toggled bit in the second memory, and performing error detection by comparing the first toggled bit stored in the first memory with the second toggled bit stored in the second memory.

Another embodiment described herein is a memory system that includes a first memory configured to store a first portion of a data word during a write operation, a second memory configured to store a second portion of the data word during the write operation, parity generator circuitry configured to receive as an input an address corresponding to the write operation and output address parity bits where one of the address parity bits is stored in the first memory during the write operation and another one of the address parity bits is stored in the second memory during the write operation, and error detection circuit configured to, during a read operation to retrieve the data word from the memory system, retrieve and compare the address parity bits stored in the first and second memories to determine whether there was an address error.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
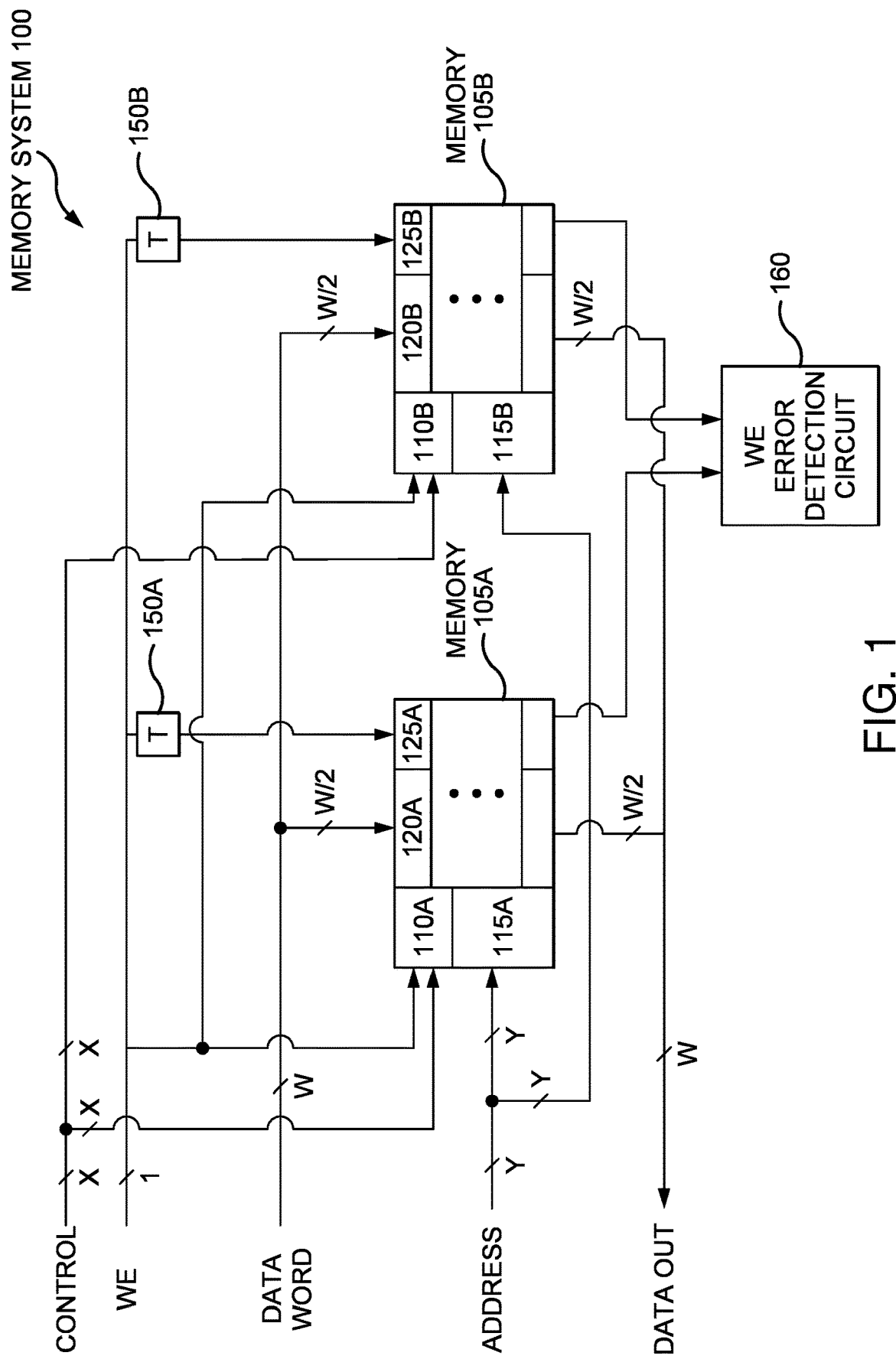
FIG. 1 is a block diagram of a memory system with WE protection, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a memory system that detects errors in control signals (e.g., WE, power gating signals, chip enable (CE), etc.) and addresses. As mentioned above, current solutions at most offer protection to addresses by combining the data word with its address when calculating the parity bit. In contrast, the embodiments below enable the control signals and addresses to have their own parity bits, independent from any protections of the data word (e.g., ECC). In this manner, the memory system can offer error detection for the control signals and the addresses, or a subset thereof. For example, the memory system may detect errors in only the WE signal and the addresses, but not the CE signal or the power gating signals. Thus, the embodiments below are flexible to offer protection for all, or only some of the control signals and addresses.

In one embodiment, a memory system with a data width (W) is split into N separate memories each of narrower width W/N. For example, where N=2, if the data words received at the memory system are 32 bits, a first half of the data words are stored in a first 16-bit wide memory while the second half of the data words are stored in a second 16-bit wide memory. The embodiments herein assume that a separate, independent data protection scheme (such as ECC) can be used to protect the data word.

To detect errors in the control signals and addresses, redundant copies of parity for the control signals and address are generated and stored in each of the N memories. Using N=2 results in the minimum overhead. However, generalizing to larger values of N allows handling cases where the data word width is large so splitting up the data word in 4 or 8 memories may make sense for other reasons (e.g. physical design constraints, only narrow RAMs are available, etc.).

In one embodiment, the WE is handled in a special way where the WE signal is toggled and then stored in each of the N memories. For example, separate toggle circuits can have states that toggle each time the WE signal goes "high", indicating that a received data word should be stored in the N memories. For example, if the toggle circuits currently store a logical one and then the WE signal goes high, the toggle circuits toggle (change to a logical zero) and their output (e.g., the logical zero) is stored in each of the N memories. When the WE signal goes high again, the toggle circuits again toggle and a logical one is stored in both of the N memories.

A fault on the WE input to any of the N memories results in its stored toggle bit being different from the toggle bits stored in the other N memories. This condition can then be detected upon any subsequent read by checking that each of the toggled bits are not equal. In other words, in the absence of a single-point fault on WE, each of the toggled bits should be equal.

In another embodiment, rather than using toggle circuits, the circuit can include a cyclic redundancy check (CRC) code generator that updates every time a write occurs. This can also catch transient faults. Thus, the embodiments herein are not limited to toggle circuits but can be used with any type of write detection circuitry that tracks when writes occur.

FIG. 1 is a block diagram of a memory system 100 with WE protection, according to an example. The memory system 100 includes two distinct memories 105A and 105B. For example, the two memories 105 may be disposed on the same integrated circuit (e.g., two RAM or ROM memory blocks on the same integrated circuit).

As shown, the memory system 100 receives a data word with a width of W which is then split and stored in the two memories 105. That is, one half of the data word (W/2) is stored in the memory 105A while the remaining half of the data word (W/2) is stored in the memory 105B. Thus, the memory system 100 (as a whole) writes and reads data words with a width W, but internally, the memory system 100 has two narrower memories 105 which have widths of W/2.

Further, while two memories 105 are shown, in other implementations the memory system may include more memories (e.g., 4 or 8) for storing portions of a received data word. For example, the memory system could include four memories that each store one quarter of the received data word (W/4). Thus, the embodiments described below can be expanded to include splitting the data word as many times as is desired and still offering WE protection.

The memory system 100 also receives control signals, address signals, and a WE signal for each received data word. While the WE signal can be considered a type of control signal, it is shown separately in FIG. 1 since this embodiment illustrates WE protection.

The control signals can include a variety of different control signals such as a power gating signal or a CE signal. These signals are generalized as control signals that include X number of bits. Similarly, the memory system 100 receives an address of Y number of bits, where the address corresponds to the address of the data word. In this embodiment, the control signals and the address is transmitted to both of the memories 105A and 105B. However, unlike the data word where different portions of the data are stored in the different memories 105, the same control signals and address are sent to both of the memories 105.

As shown, the same control signals are transmitted to a control portion 110A of the memory 105A and to a control portion 110B of the memory 105B. The same address is transmitted to an address portion 115A of the memory 105A and to an address portion 115B of the memory 105B. The memories 105 can use the control portions 110 and the address portions 115 to perform reads and writes of the data words.

However, in another embodiment, the memory system 100 may transmit different addresses to the memories 105A and 105B. That is, the memory system 100 may modify the received, original address for the data word. For example, the address used to perform a read or write in the memory 105A may be slightly offset from the address used to perform a read or write in the memory 105B.

The memory system 100 also includes toggle circuits 150A and 150B for toggling the WE signal. Specifically, the output of the toggle circuits 150 toggle each time the WE signal goes high, indicating a data word is currently being written into the memory system 100. For example, if the toggle circuits 150 currently store (and output) a one and the WE signal goes high, the toggle circuits 150 toggle to store (and output) a zero. When the WE signal goes high again (when another data word is being written into the memory system 100), the toggle circuit 150 will toggle again to store and output a one.

The current toggle bit when writing a data word is stored in both of the memories 105. That is, when writing the halves of the data word into the memories 105, the memory system 100 also stores the current output of the toggle circuits 150 in the memories 105. If there are no errors, then each time a data word is written into the memories, the corresponding toggle bits stored in the memories 105 will toggle from zero, to one, to zero, to one, etc.

For memory systems without WE protection, a stuck-inactive fault on WE can leave the data word unchanged in the memory. That is, because the WE signal was stuck, and did not go high when it should have, the data word is not written into the memory along with any ECC or parity bits stored in the memory for the data word. Thus, the fault is not detected when the data word is read out. A stuck-active would result in the data parity being written every RAM clock, so the parity would always be good on a read and the fault would go undetected.

However, by storing the toggled WE bits in the memories 105, a stuck-active WE fault can be detected using WE error detection circuit 160. As mentioned above, each of the N narrow memories 105 toggles and stores its WE at every write occurrence in a portion 125 in each memories' address. A fault on the WE input to any of the memories 105 results in that memories' stored toggled bit being different from the toggled bit stored in the other memory. This condition can be detected by the WE error detection circuit 160 upon any subsequent read of the data word. For example, when reading out the halves of a data word from the memories 105, the WE error detection circuit 160 can check whether the toggled bits stored in the portions 125A and 125B are not equal. In other words, in the absence of a single-point fault on WE, the toggled bits should be equal. In this manner, the memory system 100 offers WE protection by splitting up the data words and generating toggled bits using the WE signal.

While FIG. 1 illustrates using toggle circuits 150 to faults in the WE signal, this is just one example of a suitable write detection circuitry. Another example write detection circuitry that can be used to detect faults in the WE signal is a CRC code generator that updates CRC codes (e.g., a type of write detection bits, like the outputs of the toggle circuits 150) that are stored in the memories 105 every time a write occurs as indicated by the WE signal. If when performing a read from the two memories 105, the CRC codes stored in the memories 105 do not match, the memory system 100 knows an error occurred. Thus, the toggled bits generated by the toggle circuits 150 or the CRC codes generated by a CRC code generator can be used as write detection bits to indicate a write has occurred.

Further, embodiments herein are described at the hardware level to a RAM (e.g., memory 105) and its surrounding logic, both subject to hardware faults but they can be extended to the software level for cases where a data buffer is stored into a potentially unreliable medium, i.e. where there is a non-zero probability that the store may be late or not occur at all for various reasons (such as malfunction or excessive system latency delays). The data can be partitioned (or dis-assembled) and stored into N different areas of the storage medium, along with the equivalent N WT bits which can be checked upon read and re-assembly of the data buffer.

At the hardware level, the narrow RAMs (e.g., memories 105) are written in the exact same clock. Therefore WT can be a single bit, resolving to a single clock tick. At the system and software level, allowance might be used for a looser time resolution. In other words the N partitions may not be written at the exact same time but as long as the time difference is not excessive, it may still be acceptable. The embodiments herein can be extended by replacing the WT single bits by multi-bit Timestamps (TS) field representing the individual Write times of each of the N partitions.

Figure 2:
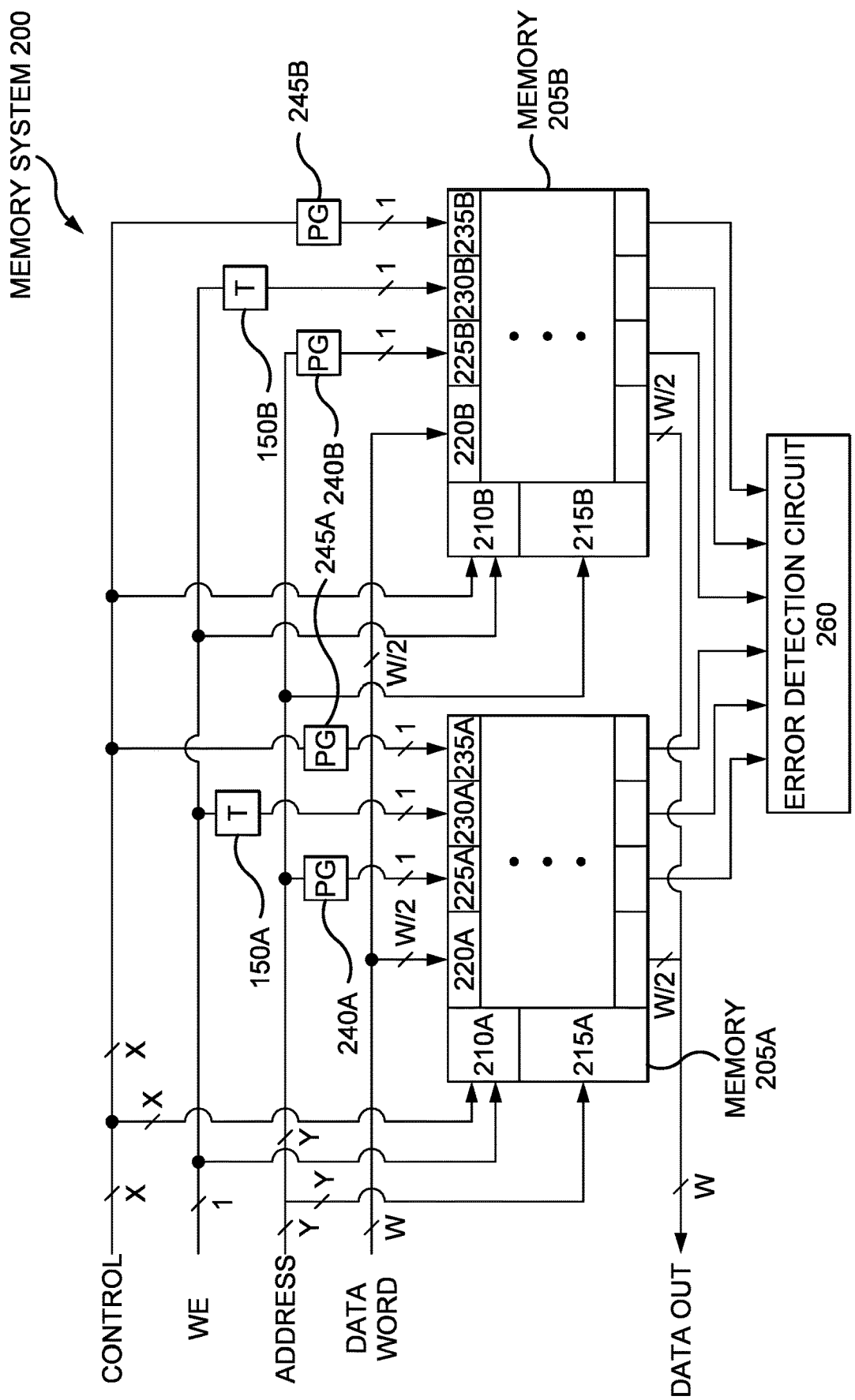
FIG. 2 is a block diagram of memory system with WE, control, and address protection, according to an example.

FIG. 2 is a block diagram of a memory system 200 with WE, control, and address protection, according to an example. Like the memory system 100 in FIG. 1, the memory system 200 splits received data words and stores a first half (W/2) in a memory 205A and a second half (W/2) in a memory 205B. That is, the memory system 200 includes two distinct memories 205A and 205B. For example, the two memories 205 may be disposed on the same integrated circuit (e.g., two RAM or ROM memory blocks on the same integrated circuit).

Further, while two memories 205 are shown, in other implementations the memory system may include more memories (e.g., 4 or 8) for storing portions of a received data word. Thus, the embodiments described below can be expanded to include splitting the data word as many times as is desired and still offering WE, control, and address protection.

As shown, the same control signals are transmitted to a control portion 210A of the memory 205A and to a control portion 210B of the memory 205B. The same address is transmitted to an address portion 215A of the memory 205A and to an address portion 215B of the memory 205B. The memories 205 can use the control portions 210 and the address portions 215 to perform reads and writes of the data words.

However, in another embodiment, the memory system 200 may transmit different addresses to the memories 205A and 205B. That is, the memory system 200 may modify the received, original address for the data word. For example, the address used to perform a read or write in the memory 205A may be slightly offset from the address used to perform a read or write in the memory 205B.

Like FIG. 1, the memory system 200 includes toggle circuits 150 for generated toggle output bits in response to the WE signal which are then stored in portions 230A and 230B of the memories 205. In addition to offering WE protection, the memory system 200 also offers protection for the address and the other control signals. To do so, in addition to transmitting the control signals and the address to respective control and address portions 210, 215 in the memories 105, the memory system 200 also includes parity generators (PG) (e.g., parity generator circuitry) for determining parity bits. In this example, the Y bits of the address are received at a PG 240A and a PG 240B which then output a respective address parity bit. Like the toggled bit generated by the WE signal, the address parity bits are stored in respective portions 225A and 225B in the memories 205.

The memory system 200 also includes PGs for determining parity bits for the control signals. In this example, the X bits of the control signals are received at a PG 245A and a PG 245B which then output a respective control signal parity bit. Like the toggled bit generated by the WE signal and the address parity bits, the control signal parity bits are stored in respective portions 235A and 235B in the memories 205. Thus, each time the memory system 200 performs a write, it generates an address parity bit, a toggled bit, and a control signal parity bit for each of the memories 205.

The embodiments herein are not limited to any particular technique for generating the address and control signal parity bits. One example technique for generating the parity bits is to perform an XOR function to generate the parity bits which are then stored in the portions 225 and 235. However, this is just one example and other techniques for generating the parity bits can be used. In another example, the parity bits can be replaced by CRC which detects errors such as bit flips or transient errors.

The memory system 200 also includes an error detection circuit 260 for determining whether there was an error corresponding to the address, WE signal, or control signals. The error detection circuit 260 can use the same techniques as described in FIG. 1 to determine an error in the WE signal (e.g., determining whether the toggle bits in the two memories 205 match). For the address and control signals, the error detection circuit 260 can also determine whether the parity bits match. That is, the circuit 260 can determine whether the address parity bit stored in the portion 225A matches the corresponding parity bit stored in the portion 225B, and whether the control signal parity bit stored in the portion 235A matches the corresponding parity bit stored in the portion 235B. Of course, this error detection technique works assuming the parity bits are generated using the same address, and the same control signals. If, for example, different addresses are sent to the memories 205 (e.g., one address is offset from the other), then the error detection circuit 260 may use a different technique to check the address parity bits to ensure there was no error in the address signal.

While FIG. 2 illustrates offering protection for WE, control, and address signals, these are independent protection schemes. Thus, in other implementations, the memory system may protect only the control and address signals (e.g., the toggle circuits could be omitted). Or the memory system could protect only the address signals (e.g., the toggle circuits and the PGs 245 for the control signals could be omitted). Thus, the memory system in FIG. 2 can be modified to protect all, or a subset of the WE, control, and address signals.

Figure 3:
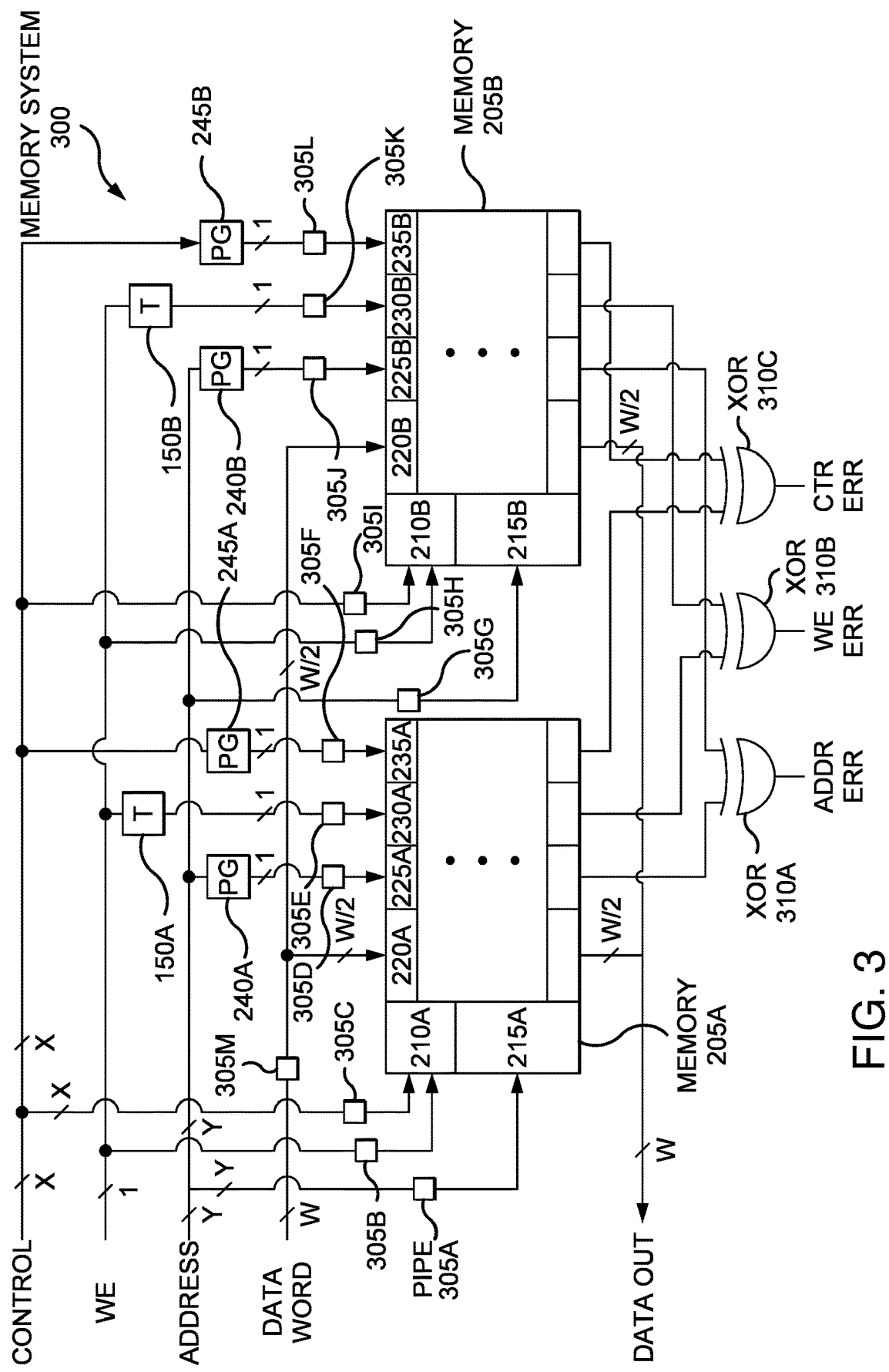
FIG. 3 is a block diagram of memory system with WE, control, and address protection, according to an example.

FIG. 3 is a block diagram of memory system 300 with WE, control, and address protection, according to an example. The memory system 300 has many of the same components as the memory system 200 in FIG. 2 and the memory system 100 in FIG. 1, as indicated by using the same reference numbers. However, FIG. 3 illustrates offering WE, control, and address protection in the presence of pipes 305, as well as one example implementation of error correction circuitry.

Many memory systems include pipes 305 (or pipelines) which are registers that are sequentially connected that delay the various signals. FIG. 3 illustrates placing the pipes 305A-M at various locations in the memory system 300. In this example, the pipes 305 are pipeline stages in front of the control, address, and write data feeding into the memories 205. In this case, the PGs 240, the PGs 245, and the toggle circuits 150 are disposed in front of the pipes 305. As a result, these circuits will also protect the pipe logic in case errors occur within the pipes 305.

The memory system 300 also includes XOR circuits 310A-C for identifying errors in the address, control, and WE signals. As shown, the XOR circuit 310A receives inputs from the portions 225A and 225B which store the address parity bits for the memories 205. If the address parity bits match (e.g., both zero or both one), the output of the XOR circuit 310A is a zero indicating there is no address error. However, if the address parity bits do not match, the output of the XOR circuit 310A is a one indicating an error in the address.

The XOR circuit 310B receives inputs from the portions 230A and 230B which store the toggled bits for the memories 205. If the toggled bits match (e.g., both zero or both one), the output of the XOR circuit 310B is a zero indicating there is no WE error. However, if the toggled bits do not match, the output of the XOR circuit 310B is a one indicating an error in the WE signal.

The XOR circuit 310C receives inputs from the portions 235A and 235B which store the control signal parity bits for the memories 205. If the control signal parity bits match (e.g., both zero or both one), the output of the XOR circuit 310C is a zero indicating there is no control signal error. However, if the control signal parity bits do not match, the output of the XOR circuit 310C is a one indicating an error in the control signals.

Figure 4:
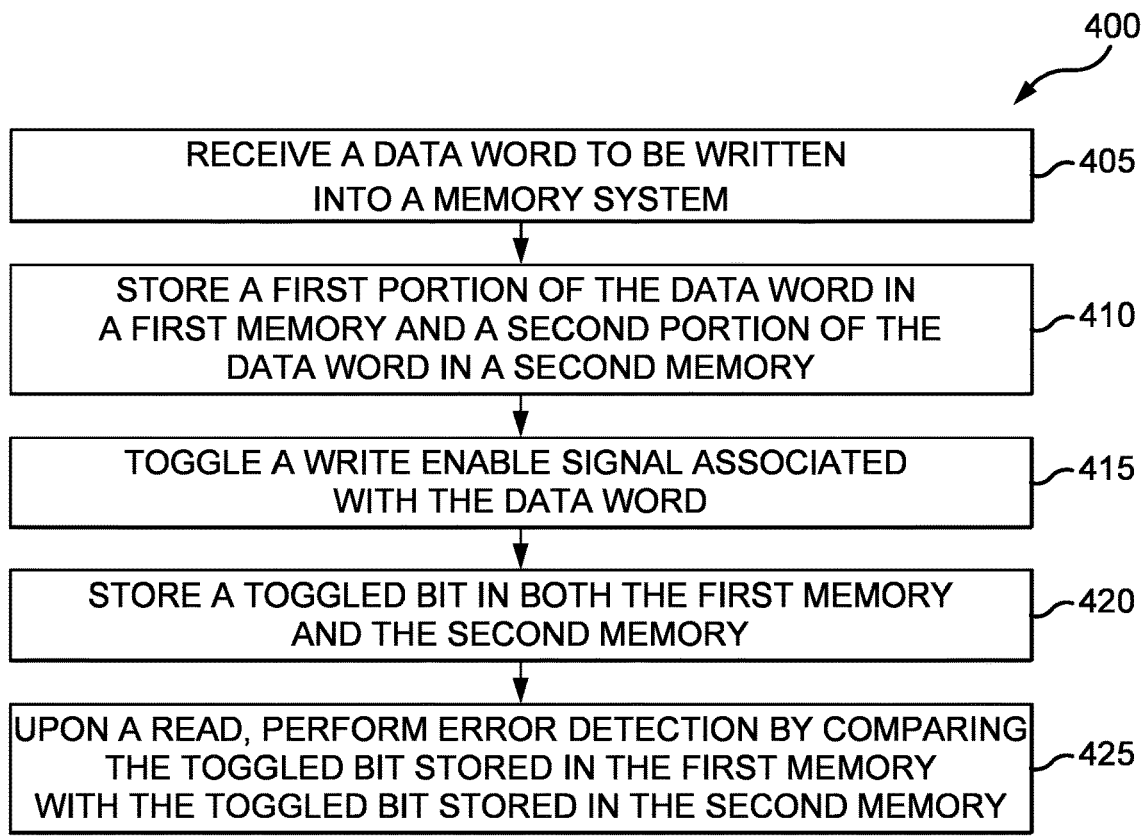
FIG. 4 is a flowchart for detecting an error with the WE signal, according to an example.

FIG. 4 is a flowchart of a method 400 for detecting an error with the WE signal, according to an example. At block 405, during a write operation, the memory system receives a data word to be written into its memories. For example, the memory system can be any one of the memory systems described in FIG. 1, 2, or 3. For example, the memory system can receive control signals, a WE signal (currently in a state indicating a write should be performed), an address, and a data word.

At block 410, the memory system stores a first portion of the data word in a first memory and a second portion of the data word in a second memory. That is, the memory system splits the received data word at least once, but in other embodiments, the data word may be split N number of times and stored in N number of memories, where N is greater than or equal to 2.

At block 415, the memory system toggles the WE signal associated with data word. For example, the WE signal controls toggle circuits that toggle their output each time the WE signal indicates the memory system is performing a write.

At block 420, the memory system stores a toggled bit in both the first memory and the second memory. That is, in addition to storing the respective portions of the data word, the memories store toggled bits which are output by the toggle circuits.

At block 425, upon a read operation, the memory system performs error detection by comparing the toggled bit stored in the first memory with the toggled bit stored in the second memory. For example, if there was a stuck-active WE error where the WE signal was stuck for one of the memories, the toggle bits will not match. As such, when performing a read to retrieve the respective portions of a data word, the memory system can check the toggled bits stored at those locations to ensure they match. If not, the memory system can indicate there was an error with the WE signal when writing the data word into the memory system.

Figure 5:
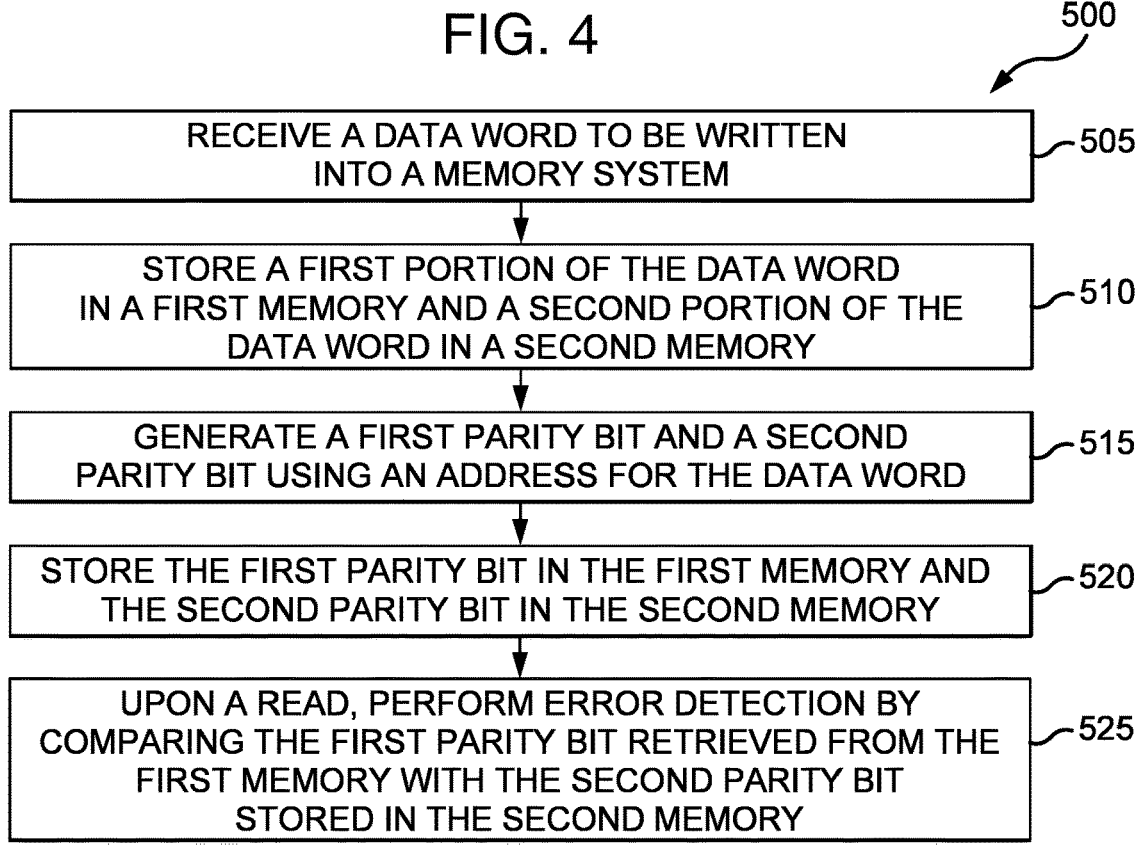
FIG. 5 is a flowchart for detecting an error with the address, according to an example.

FIG. 5 is a flowchart of a method 500 for detecting an error with the address, according to an example. At block 505, the memory system receives a data word to be written into its memories. For example, the memory system can be any one of the memory systems described in FIG. 1, 2, or 3. For example, the memory system can receive control signals, a WE signal (currently in the state indicating a write should be performed), an address, and a data word.

At block 510, the memory system stores a first portion of the data word in a first memory and a second portion of the data word in a second memory. That is, the memory system splits the received data word at least once, but in other embodiments, the data word may be split N number of times and stored in N number of memories, where N is greater than or equal to 2.

At block 515, the memory system generates a first parity bit and a second parity bit using an address for the data word. In one embodiment, the memory system includes respective PGs that receive the address and output respective parity bits by, e.g., performing an XOR function on the bits of the address.

At block 520, the memory system stores the first parity bit in the first memory and the second parity bit in the second memory.

At block 525, upon a read, the memory system performs error detection by comparing the first parity bit retrieved from the first memory with the second parity bit retrieved from the second memory. For example, if the address became corrupted at one (or both) of the memories, the first and second parity bits will likely not match. As such, when performing a read to retrieve the respective portions of a data word, the memory system can check the parity bits stored at those locations to ensure they match. If not, the memory system can indicate there was an error with the address when writing the data word into the memory system.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A memory system, comprising:
   a first memory configured to store a first portion of a data word during a write operation;
   a second memory configured to store a second portion of the data word during the write operation;
   write detection circuitry configured to receive as an input a write enable (WE) signal corresponding to the write operation and output write detection bits indicating a write occurred, wherein one of the write detection bits is stored in a first location during the write operation and another one of the write detection bits is stored in a second location during the write operation; and
   an error detection circuit configured to, during a read operation to retrieve the data word from the memory system, retrieve and compare the write detection bits stored in the first and second locations to each other to determine whether there was an WE error.

2. The memory system of claim 1, wherein at least one of:
   the write detection circuitry comprises a toggle circuit configured to toggle an output each time the WE signal indicates a write operation is to be performed, or
   the write detection circuitry comprises a CRC code generator configured to generate CRC codes each time the WE signal indicates a write operation is to be performed.

3. The memory system of claim 1, wherein the first portion of the data word is different than the second portion of the data word.

4. The memory system of claim 1, wherein the memory system comprises N number of memories which includes the first and second memories, wherein the data word is split N times and stored in the N number of memories.

5. The memory system of claim 1, wherein the error detection circuit comprises an exclusive or (XOR) circuit configured to receive the write detection bits stored in the first and second locations to determine whether there was the WE error.

6. The memory system of claim 1, further comprising:
   a first parity generator circuit configured to receive an address corresponding to the write operation, generate a first address parity bit based on the address, and store the first address parity bit in the first memory during the write operation; and
   a second parity generator circuit configured to receive the address, generate a second address parity bit, and store the second address parity bit in the second memory during the write operation,
   wherein the error detection circuit is configured to, during the read operation, retrieve and compare the first and second address parity bits stored in the first and second memories to determine whether there was an address error.

7. The memory system of claim 6, further comprising:
   a third parity generator circuit configured to receive control signals corresponding to the write operation, generate a first control signal parity bit based on the control signals, and store the first control signal parity bit in the first memory during the write operation; and
   a fourth parity generator circuit configured to receive the control signals, generate a second control signal parity bit, and store the second control signal parity bit in the second memory during the write operation,
   wherein the error detection circuit is configured to, during the read operation, retrieve and compare the first and second control signal parity bits stored in the first and second memories to determine whether there was a control signal error.

8. The memory system of claim 1, wherein the first location is in the first memory and the second location is in the second memory.

9. A method, comprising:
   receiving, during a write operation, a data word to be written into a memory system comprising a first memory and a second memory;
   storing a first portion of the data word in the first memory and a second portion of the data word in the second memory;
   toggling a WE signal associated with the data word to generate first and second toggled bits;
   storing a first toggled bit in a first location and a second toggled bit in a second location; and
   performing error detection by comparing the first toggled bit stored in the first location with the second toggled bit stored in the second location.

10. The method of claim 9, wherein toggling the WE signal comprises toggling an output of a toggle circuit each time the WE signal indicates a write operation is to be performed.

11. The method of claim 9, wherein the first portion of the data word is different than the second portion of the data word.

12. The method of claim 9, further comprising:
    generating a first address parity bit based on an address corresponding to the write operation;
    storing the first address parity bit in the first memory during the write operation;
    generating a second address parity bit based on the address;
    storing the second address parity bit in the second memory during the write operation; and
    retrieving and comparing, during a read operation, the first and second address parity bits stored in the first and second memories to determine whether there was an address error.

13. The method of claim 9, further comprising:
    generating a first control signal parity bit based on control signals corresponding to the write operation;
    storing the first control signal parity bit in the first memory during the write operation;
    generating a second control signal parity bit based on the control signals;
    storing the second control signal parity bit in the second memory during the write operation; and
    retrieving and comparing, during a read operation, the first and second control signal parity bits stored in the first and second memories to determine whether there was a control signal error.

14. The method of claim 9, wherein the first location is in the first memory and the second location is in the second memory.

15. A memory system, comprising:
    a first memory configured to store a first portion of a data word during a write operation;
    a second memory configured to store a second portion of the data word during the write operation;
    parity generator circuitry configured to receive as an input an address corresponding to the write operation and output address parity bits, wherein one of the address parity bits is stored in the first memory during the write operation and another one of the address parity bits is stored in the second memory during the write operation; and an error detection circuit configured to, during a read operation to retrieve the data word from the memory system, retrieve and compare the address parity bits stored in the first and second memories to each other to determine whether there was an address error.

16. The memory system of claim 15, wherein the first portion of the data word is different than the second portion of the data word.

17. The memory system of claim 15, wherein the memory system comprises N number of memories which includes the first and second memories, wherein the data word is split N times and stored in the N number of memories.

18. The memory system of claim 15, wherein the error detection circuit comprises an exclusive or (XOR) circuit configured to receive the address parity bits stored in the first and second memories to determine whether there was the address error.

19. The memory system of claim 15, wherein the parity generator circuitry comprises a first parity generator circuit configured to receive the address and output one of the address parity bits and a second parity generator circuit configured to receive the address and output another one of the address parity bit.

20. The memory system of claim 19, further comprising:
a third parity generator circuit configured to receive control signals corresponding to the write operation, generate a first control signal parity bit based on the control signals, and store the first control signal parity bit in the first memory during the write operation; and
a fourth parity generator circuit configured to receive the control signals, generate a second control signal parity bit, and store the second control signal parity bit in the second memory during the write operation,
wherein the error detection circuit is configured to, during the read operation, retrieve and compare the first and second control signal parity bits stored in the first and second memories to determine whether there was a control signal error.

* * * * *